United States Patent
Chung et al.

(10) Patent No.: US 8,270,207 B2
(45) Date of Patent: Sep. 18, 2012

(54) RAISING PROGRAMMING CURRENT OF MAGNETIC TUNNEL JUNCTIONS BY APPLYING P-SUB BIAS AND ADJUSTING THRESHOLD VOLTAGE

(75) Inventors: Shine Chung, San Jose, CA (US);
Tao-Wen Chung, Zhubei (TW);
Chun-Jung Lin, Hsin-Chu (TW);
Yu-Jen Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 78 days.

(21) Appl. No.: 12/687,720

(22) Filed: Jan. 14, 2010

(65) Prior Publication Data
US 2010/0265759 A1    Oct. 21, 2010

Related U.S. Application Data

(60) Provisional application No. 61/170,074, filed on Apr. 16, 2009.

(51) Int. Cl.
*G11C 11/00*  (2006.01)

(52) U.S. Cl. ........ 365/158; 365/148; 365/163; 365/171; 365/173; 365/230.06

(58) Field of Classification Search .................. 365/148, 365/158, 163, 171, 173, 189.16, 174, 209, 365/232, 243.5, 225.5, 189.011
See application file for complete search history.

(56) References Cited

U.S. PATENT DOCUMENTS

| | | | | |
|---|---|---|---|---|
| 6,873,561 B2 * | 3/2005 | Ooishi | ............ | 365/226 |
| 7,286,394 B2 * | 10/2007 | Ooishi | ............ | 365/158 |
| 7,515,457 B2 * | 4/2009 | Chen et al. | .......... | 365/158 |

* cited by examiner

*Primary Examiner* — Hoai V Ho
*Assistant Examiner* — Kretelia Graham
(74) *Attorney, Agent, or Firm* — Slater & Matsil, L.L.P.

(57) ABSTRACT

A method of operating magneto-resistive random access memory (MRAM) cells includes providing an MRAM cell, which includes a magnetic tunneling junction (MTJ) device and a word line selector having a source-drain path serially coupled to the MTJ device. A negative substrate bias voltage is connected to a body of the word line selector to increase the drive current of the word line selector. The threshold voltage of the word line selector is also reduced.

24 Claims, 4 Drawing Sheets

RAISING PROGRAMMING CURRENT OF MAGNETIC TUNNEL JUNCTIONS BY APPLYING P-SUB BIAS AND ADJUSTING THRESHOLD VOLTAGE

This application claims the benefit of U.S. Provisional Application No. 61/170,074 filed on Apr. 16, 2009, entitled "Raising Programming Current of Magnetic Tunnel Junctions by Applying P-Sub Bias and Adjusting Threshold Voltage," which application is hereby incorporated herein by reference.

TECHNICAL FIELD

The present invention relates generally to memory devices, and more particularly to the writing (programming) of magneto-resistive random access memory (MRAM) devices.

BACKGROUND

Semiconductor storage devices are used in integrated circuits for electronic applications, including radios, televisions, cell phones, and personal computing devices. Commonly known storage devices include charge-storing devices such as dynamic random access memories (DRAMs) and flash memories.

A more recent development in storage devices involves spin electronics, which combine semiconductor technology and magnetic materials. The spin polarization of electrons, rather than the charge of the electrons, is used to indicate the state of "1" or "0." One such spin electronic device is a spin torque transfer (STT) magnetic tunneling junction (MTJ) device 10, as shown in FIG. 1.

MTJ device 10 includes free layer 12, tunnel layer 14, and pinned layer 16. The magnetization direction of free layer 12 can be reversed by applying a current through tunnel layer 14, which causes the injected polarized electrons within free layer 12 to exert spin torques on the magnetization of free layer 12. Pinned layer 16 has a fixed magnetization direction. When current I1 flows in the direction from free layer 12 to pinned layer 16, electrons flow in a reverse direction, that is, from pinned layer 16 to free layer 12. The electrons are polarized to the same magnetization direction of pinned layer 16 after passing pinned layer 16, flowing through tunnel layer 14, and then into and accumulating in free layer 12. Eventually, the magnetization of free layer 12 is parallel to that of pinned layer 16, and MTJ device 10 will be at a low resistance state. The electron injection caused by current I1 is referred to as a major injection.

When current I2 flowing from pinned layer 16 to free layer 12 is applied, electrons flow in the direction from free layer 12 to pinned layer 16. The electrons having the same polarization as the magnetization direction of pinned layer 16 are able to flow through tunnel layer 14 and into pinned layer 16. Conversely, electrons with a polarization differing from the magnetization of pinned layer 16 will be reflected (blocked) by pinned layer 16, and will accumulate in free layer 12. Eventually, magnetization of free layer 12 becomes anti-parallel to that of pinned layer 16, and MTJ device 10 will be at a high-resistance state. The respective electron injection caused by current I2 is referred to as a minor injection.

To eliminate the parasitic loading of MRAM cells, when MRAM cells are integrated in MRAM arrays, word line selectors are used to electrically isolate unselected MRAM cells, on which no operations are to be performed, from source lines. For example, FIG. 2 illustrates an MRAM cell including MTJ device 10 connected to word line selector 20, which is controlled by word line 22. When MTJ device 10 is selected for writing or reading, word line 22 is set to logic high, so that writing/reading current I can pass MTJ device 10. For the unselected rows, word line 22 is applied with a logic low voltage. The addition of word line selector 20, however, limits the current that can flow through MTJ device 10. The writing current I of MTJ device 10 is limited by the current-providing capacity of word line selector 20. To effectively and reliably program MTJ device 10, writing current I needs to be very high. However, this requires word line selector 20 to be large. The increase in the size of word line selector 20 causes an increase in the required chip area usage by the MRAM cell. The requirement to increase the size of word line selector 20 conflicts with the demand of increasing the density of MRAM arrays. A solution is thus needed.

SUMMARY OF THE INVENTION

In accordance with one aspect of the present invention, a method of operating magneto-resistive random access memory (MRAM) cells includes providing an MRAM cell, which includes a magnetic tunneling junction (MTJ) device and a word line selector having a source-drain path serially coupled to the MTJ device. A negative bias voltage is connected to a body of the word line selector to increase a drive current of the word line selector.

In accordance with another aspect of the present invention, a method of operating MRAM cells includes providing an MRAM cell, which includes an MTJ device and a word line selector having a source-drain path serially coupled to the MTJ device. The method further includes connecting a negative bias voltage to a body of the word line selector; turning on the word line selector; and applying a writing current flowing through the source-drain path of the word line selector during a period the negative bias voltage is applied.

In accordance with yet another aspect of the present invention, an integrated circuit includes an MRAM cell including an MTJ device and a word line selector having a source-drain path serially coupled to the MTJ device. A power source is coupled to, and configured to provide a negative bias voltage to, a body of the word line selector.

In accordance with yet another aspect of the present invention, an integrated circuit includes an MRAM cell including an MTJ device and a word line selector having a source-drain path serially coupled to the MTJ device. The word line selector has a threshold voltage less than about 0.2V.

The advantageous features of the present invention include increased driving ability in word line selectors without requiring an increase in the size of the word line selectors.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Novel magneto-resistive random access memory (MRAM) circuits are presented. The variations and the operation of the embodiments are discussed. Throughout the various views and illustrative embodiments of the present invention, like reference numbers are used to designate like elements.

Figure 1:
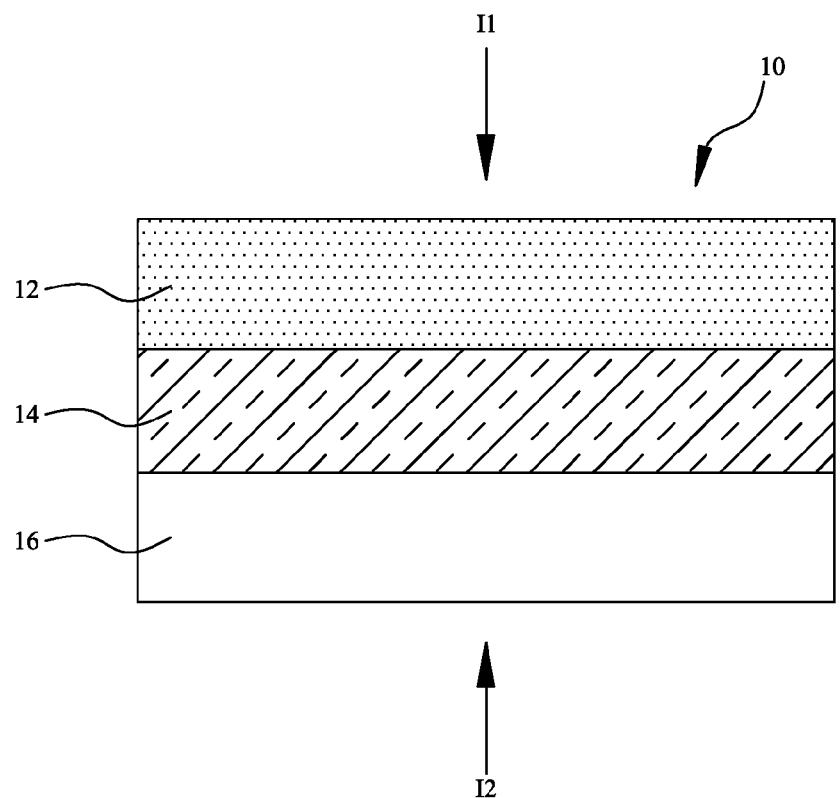
FIG. 1 illustrates a cross-sectional view of a magnetic tunnel junction (MTJ) cell.
Figure 2:
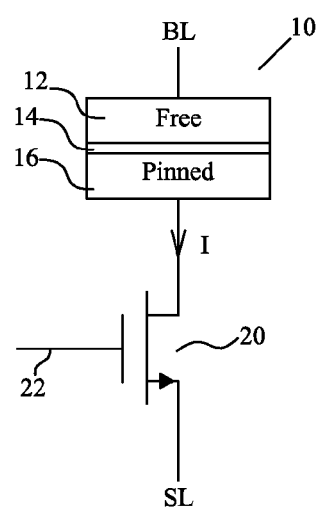
FIG. 2 illustrates an MRAM cell controlled by a word line selector.
Figure 3:
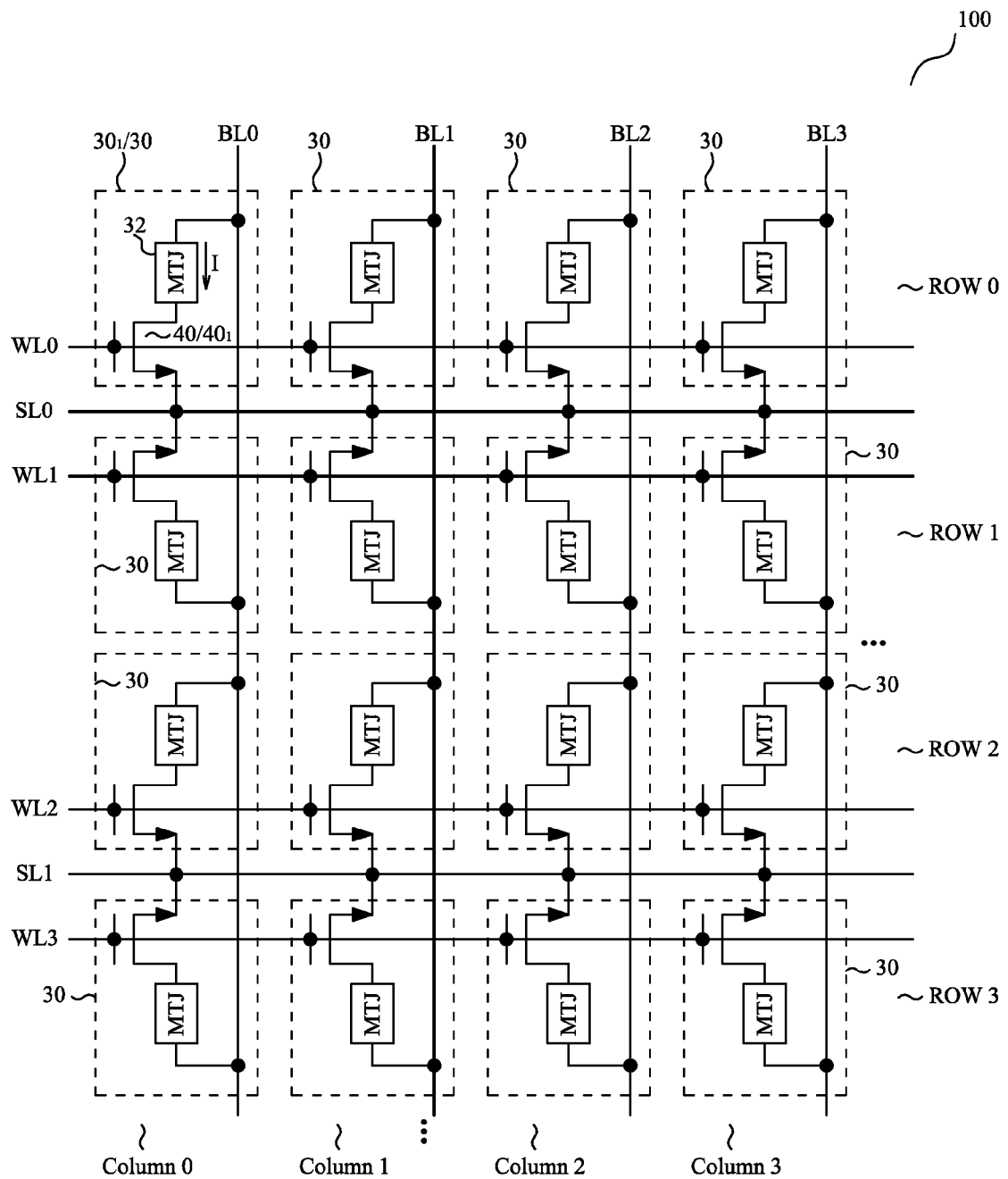
FIG. 3 illustrates an MRAM array.

FIG. 3 illustrates an embodiment, which includes MRAM array 100 comprising a plurality of MRAM cells 30 arranged in rows (denoted as Row 0, Row 1, Row 2, and the like) and columns (denoted as Column 0, Column 1, Column 2, and the like). Bit-lines BL (denoted as BL0, BL1, BL2, and the like) extend in the column direction. Word lines WL (denoted as WL0, WL1, WL2, and the like) and source lines SL (denoted as SL0, SL1, and the like) extend in the row direction. It is appreciated that the row direction and the column direction are interchangeable, depending on from which direction MRAM array 100 is viewed.

Each of MRAM cells 30 is coupled between one of bit-lines BL and one of source lines SL. Each of MRAM cells 30 includes magnetic tunnel junction (MTJ) 32 and word line selector (also known as word line driver) 40, which may be an N-type metal-oxide-semiconductor (MOS) device (transistor). Word line selectors 40 have their source-drain paths serially connected to the respective MTJ devices 32 in the same MRAM cells, and hence they may isolate MTJ devices 32 from, or connect MTJ devices 32 to, the respective source lines SL when turned off. When writing or reading operations are performed to one of the MRAM cells 30, the respective word line selector 40 is turned on so that the writing or reading current I can flow through MRAM cell 30. Although FIG. 3 illustrates that word line selectors 40 are closer to the respective source lines SL than to the respective bit-lines BL, word line selectors 40 may also be placed closer to the respective bit-lines BL.

Figure 4A:
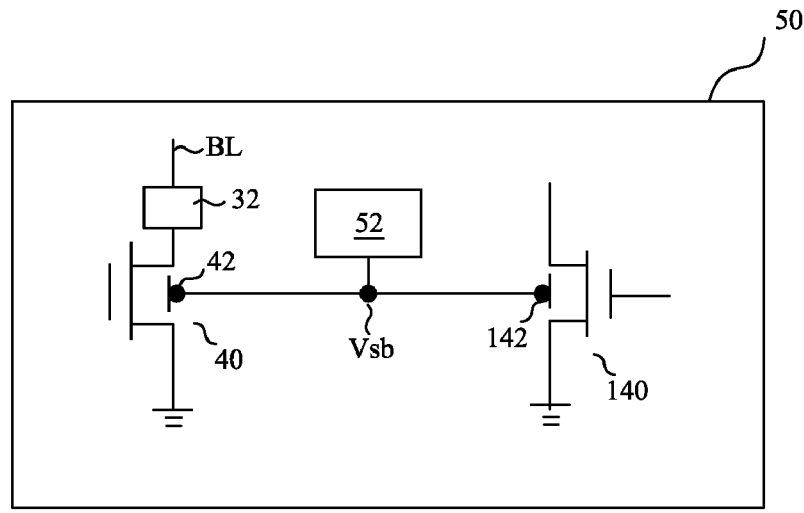
FIG. 4A schematically illustrates an MRAM cell and a negative power source providing a negative bias voltage to bodies of a word line selector of the MRAM cell and an additional NMOS device.

FIG. 4A schematically illustrates semiconductor chip 50, in which MRAM array 100 as shown in FIG. 3 is formed. For a clear view, only one of MRAM cells 30 in MRAM array 100 is shown. The teaching regarding the illustrated MRAM cell 30, however, applies to all other MRAM cells 30 in MRAM array 100. Negative bias power source 52 provides a negative substrate bias voltage Vsb to body 42 (also shown in FIG. 5A) of word line selector 40. In an embodiment, negative substrate bias voltage Vsb is lower than about −0.5V, although higher negative voltages can also be used. Due to the negative substrate bias voltage Vsb, the drive current of word line selector 40 is increased.

Figure 5A:
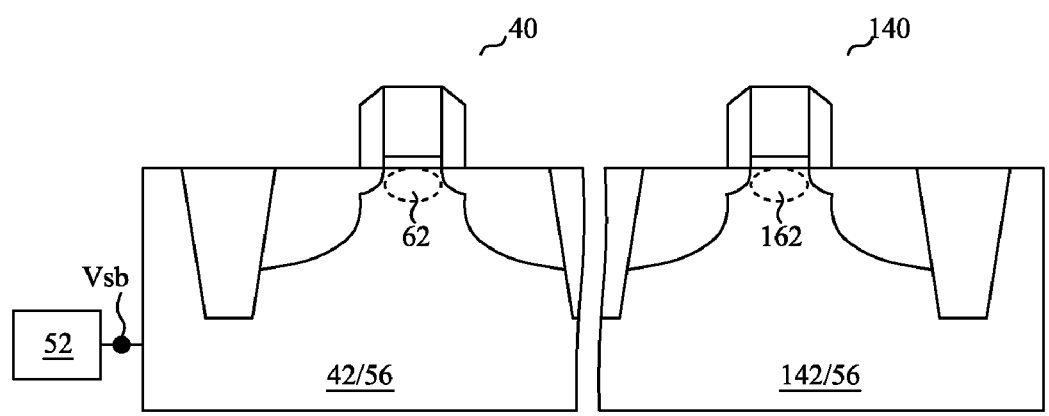
FIG. 5A illustrates a cross-sectional view of the word line selector and the additional NMOS device as shown in FIG. 4A.

It is realized that besides MRAM array 100, on chip 50 there are other integrated circuits such as logic circuits (for example, control circuits of MRAM array 100), which includes logic NMOS devices and logic PMOS devices. An exemplary logic NMOS device 140 is shown in FIG. 4A. In an embodiment, logic MOS device 140 is formed directly in a p-type substrate, and hence its body 142 is part of the respective substrate. Accordingly, the negative substrate bias voltage Vsb may be applied directly to substrate 56 of chip 50 (not shown in FIG. 4A, refer to FIG. 5A). FIG. 5A illustrates a cross-sectional view of the circuit shown in FIG. 4A. It is observed that devices 40 and 140 share a common substrate 56, and hence when negative substrate bias voltage Vsb is applied to substrate 56, the same negative substrate bias voltage Vsb is also applied to body 142 of MOS device 140.

Figure 4B:
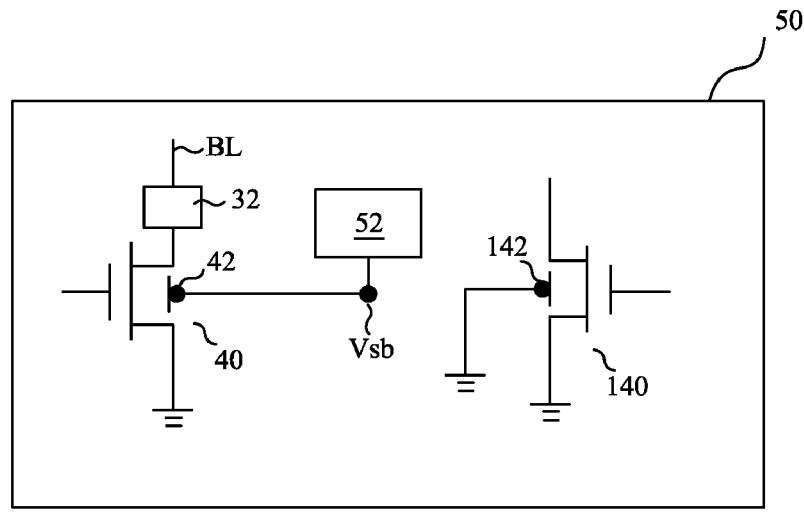
FIG. 4B schematically illustrates an MRAM cell and a negative power source providing a negative bias voltage to a body of a word line selector of the MRAM cell, wherein a body of an additional NMOS device is applied with a voltage different from the negative bias voltage.
Figure 5B:
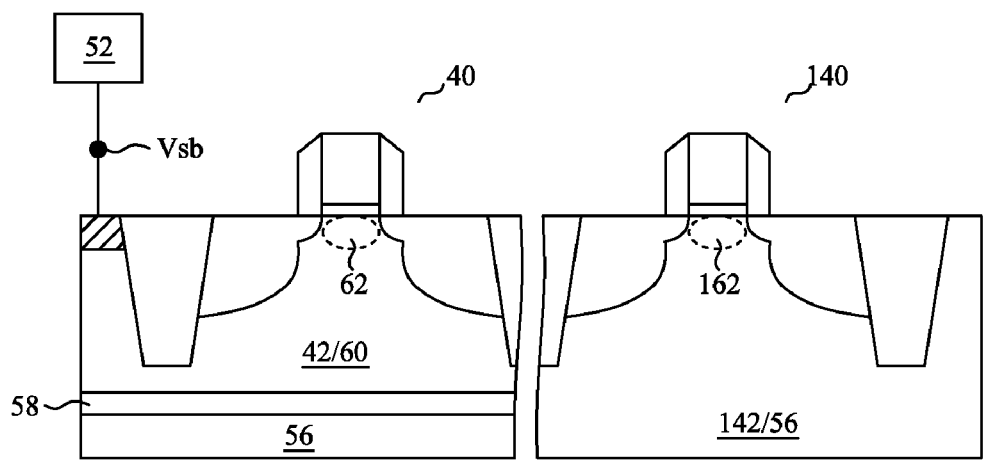
FIG. 5B illustrates a cross-sectional view of the word line selector and the additional NMOS device as shown in FIG. 4B.

In alternative embodiments, as shown in FIGS. 4B and 5B, the body of word line selector 40 may be electrically isolated from the body of MOS device 140, so that different body voltages can be applied. For example, FIG. 4B illustrates that body 42 of word line selector 40 is applied with negative substrate bias voltage Vsb, while body 142 of MOS device 140 is applied with a different voltage, which may be higher than, equal to, or lower than, negative substrate bias voltage Vsb. In an exemplary embodiment, body 142 of MOS device 140 is grounded.

FIG. 5B illustrates an exemplary cross-sectional view of the circuit as shown in FIG. 4B. In an embodiment, word line selector 40 may be formed in P-well 60, which may be electrically insulated from p-type substrate 56 by deep N-well 58. Accordingly, negative substrate bias voltage Vsb may be applied to body 42 of word line selector 40, but not to the bodies of some of the other MOS devices in the same chip, such as MOS device 140. In alternative embodiments (not shown), MOS device 140 may be formed in P-well 60 that is electrically insulated from substrate 56, while MOS device 40 is formed directly in substrate 56. Similarly, with this structure, bodies 42 and 142 can also be applied with different voltages.

In an embodiment, the negative substrate bias voltage Vsb is applied only when write operations are performed to MRAM cells 30. When no write operation is performed to any of the MRAM cells 30, for example, either read operations are performed, or no operation is performed, bodies 42 of word line selectors 40 may be connected to other voltages, for example, electrical ground. In the embodiments as shown in FIGS. 4B and 5B, negative substrate bias voltage Vsb may also be applied to only the MRAM cells that are selected for write operations, while other unselected cells, or cells in unselected rows or unselected columns, are applied with voltages (for example, electrical ground (0V)) different from negative substrate bias voltage Vsb. To achieve this function, negative bias power source 52 (FIGS. 4A and 4B) may include a plurality of outputs, each connected to bodies of one row or one column of word line selectors 40. It is appreciated that there may be many variations as to how to differentiate the body bias voltage between selected/unselected MRAM cells, selected/unselected rows, and/or selected/unselected columns, which variations are also in the scope of the embodiments of the present invention.

To further increase the drive currents of word line selectors 40, the threshold voltage of word line selector 40 may be reduced. As is known in the art, the drive current of a MOS transistor is related to (Vgs−Vt), wherein Vgs is the gate-to-source voltage and Vt is the threshold voltage. Particularly, when operated in a saturation region, the drive current of the MOS transistor is proportional to the square of (Vgs−Vt). Accordingly, the reduction in threshold voltage Vt of word line selectors 40 results in an increase in its drive current. In an embodiment, threshold voltage Vt of word line selectors 40 is lower than about 0.2V, or even lower than about 0.1V.

Referring to FIGS. 5A and 5B, in an embodiment, the reduction of threshold voltage Vt may be achieved by reducing the p-type impurity concentration in channel region 62, which p-type impurity is introduced during a Vt-adjustment doping step. Increasing the p-type doping concentration in channel region 62 may cause an increase in threshold voltage Vt, while reducing the p-type doping concentration in channel region 62 may cause a reduction in threshold voltage Vt. Accordingly, the p-type impurity concentration in channel region 162 needs to be reduced. On the other hand, for other devices on chip 50, higher threshold voltages may be needed. For example, the threshold voltage of MOS device 140 may be greater than about 0.4V, which may be achieved by doping channel region 162 more heavily with p-type impurities than channel region 62.

The embodiments of the present invention have several advantageous features. By biasing the bodies of word line selectors with negative voltages and/or reducing the doping concentration in the bodies of word line selectors 40, the drive currents of word line selectors 40 may be increased without requiring an increase in chip area usage. Accordingly, high-density MRAM arrays with improved reliability and improved writing speed may be formed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of operating a magneto-resistive random access memory (MRAM) cell, the method comprising:
   providing the MRAM cell comprising:
      a magnetic tunneling junction (MTJ) device; and
      a word line selector comprising a source-drain path serially coupled to the MTJ device, wherein the word line selector has a threshold voltage lower than an additional threshold voltage of an NMOS transistor, wherein the NMOS transistor is on a same chip as the MRAM cell, and wherein a channel region of the word line selector has a lower doping concentration than a channel region of the NMOS transistor; and
   connecting a negative substrate bias voltage to a body of the word line selector.

2. The method of claim 1, wherein the negative substrate bias voltage is lower than about −0.5V.

3. The method of claim 1, wherein the negative substrate bias voltage is connected to the body of the word line selector during a write operation of the MRAM cell.

4. The method of claim 3 further comprising, during a read operation of the MRAM cell, connecting a non-negative voltage to the body of the word line selectors.

5. The method of claim 4, wherein the non-negative voltage is an electrical ground voltage.

6. The method of claim 3 further comprising, during the write operation of the MRAM cell, connecting a non-negative voltage to a body of an additional MRAM cell in a same MRAM array as the MRAM cell.

7. The method of claim 6, wherein, when the non-negative voltage is connected to the body of the additional MRAM cell, no write operation is performed on the additional MRAM cell.

8. The method of claim 1, wherein the body of the word line selector comprises a P-well, wherein a deep N-well separates the P-well from a p-type substrate, and wherein the method further comprises grounding the p-type substrate.

9. The method of claim 1 further comprising grounding a body of the NMOS transistor.

10. The method of claim 1, wherein the word line selector has the threshold voltage lower than about 0.2V.

11. A method of operating a magneto-resistive random access memory (MRAM) cell, the method comprising:
   providing the MRAM cell comprising:
      a magnetic tunneling junction (MTJ) device; and
      a word line selector comprising a source-drain path serially coupled to the MTJ device, wherein the word line selector has a threshold voltage lower than an additional threshold voltage of an NMOS transistor, wherein the NMOS transistor is on a same chip as the MRAM cell, and wherein a channel region of the word line selector has a lower doping concentration than a channel region of the NMOS transistor;
   connecting a negative substrate bias voltage to a body of the word line selector;
   turning on the word line selector; and
   applying a writing current flowing through the source-drain path of the word line selector during a period the negative substrate bias voltage is applied.

12. The method of claim 11, wherein the negative substrate bias voltage is lower than about −0.5V.

13. The method of claim 12 further comprising, during a read operation of the MRAM cell, connecting a non-negative voltage to the body of the word line selector.

14. The method of claim 13, wherein the non-negative voltage is an electrical ground voltage.

15. The method of claim 11, wherein the body of the word line selector comprises a P-well, wherein a deep N-well separates the P-well from a p-type substrate, and wherein the method further comprises grounding the p-type substrate.

16. The method of claim 11, wherein the word line selector has the threshold voltage lower than about 0.2V.

17. An integrated circuit comprising:
   a magneto-resistive random access memory (MRAM) cell comprising:
      a magnetic tunneling junction (MTJ) device; and
      a word line selector comprising a source-drain path serially coupled to the MTJ device;
   a power source coupled to, and configured to provide a negative substrate bias voltage to, a body of the word line selector;
   a p-type substrate;
   a deep N-well over the p-type substrate;
   a P-well over the deep N-well, wherein the P-well is electrically insulated from the p-type substrate by the deep N-well, and wherein the body of the word line selector is a portion of the P-well; and an NMOS device on a same chip as the word line selector, wherein no well region is between a channel region of the NMOS device and the p-type substrate.

18. The integrated circuit of claim 17, wherein the negative substrate bias voltage is lower than about −0.5 V.

19. The integrated circuit of claim 17, wherein the word line selector has a threshold voltage lower than about 0.2V.

20. The integrated circuit of claim 17, wherein the p-type substrate is grounded.

21. The integrated circuit of claim 17, wherein the word line selector has a threshold voltage lower than a threshold voltage of the NMOS device.

22. An integrated circuit comprising:
  a magneto-resistive random access memory (MRAM) cell comprising:
    a magnetic tunneling junction (MTJ) device; and
    a word line selector comprising a source-drain path serially coupled to the MTJ device, wherein the word line selector has a threshold voltage less than about 0.2V, wherein the threshold voltage is lower than an additional threshold voltage of an NMOS transistor, wherein the NMOS transistor is on a same chip as the MRAM cell, and wherein a channel region of the word line selector has a lower doping concentration than a channel region of the NMOS transistor.

23. The integrated circuit of claim 22 further comprising a power source coupled to, and configured to provide a negative substrate bias voltage to, a body of the word line selector.

24. The integrated circuit of claim 23, wherein the negative substrate bias voltage is lower than about −0.5V.

* * * * *